(12) United States Patent
Chen et al.

(10) Patent No.: US 10,916,636 B2
(45) Date of Patent: Feb. 9, 2021

(54) METHOD OF FORMING GATE

(71) Applicant: UNITED MICROELECTRONICS CORP., Hsin-Chu (TW)

(72) Inventors: Po-Tsang Chen, Tainan (TW); Wen-Liang Huang, Hsinchu (TW); Chun-Chi Yu, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/276,642

(22) Filed: Feb. 15, 2019

(65) Prior Publication Data
US 2020/0266285 A1 Aug. 20, 2020

(51) Int. Cl.
*H01L 29/66* (2006.01)
*H01L 21/28* (2006.01)
*H01L 21/027* (2006.01)
*H01L 29/49* (2006.01)

(52) U.S. Cl.
CPC .... *H01L 29/66545* (2013.01); *H01L 21/0276* (2013.01); *H01L 21/28141* (2013.01); *H01L 29/4958* (2013.01); *H01L 29/6656* (2013.01); *H01L 29/6659* (2013.01)

(58) Field of Classification Search
CPC ............. H01L 29/66545; H01L 29/4958
See application file for complete search history.

(56) References Cited

U.S. PATENT DOCUMENTS

| | | | |
|---|---|---|---|
| 2014/0183642 A1* | 7/2014 | Liang | H01L 21/823412 257/368 |
| 2015/0064906 A1 | 3/2015 | Sel | |
| 2015/0348787 A1* | 12/2015 | Cai | H01L 21/28035 257/368 |
| 2016/0064510 A1* | 3/2016 | Mueller | H01L 27/11507 257/295 |
| 2017/0084686 A1* | 3/2017 | Wang | H01L 29/0638 |
| 2017/0154972 A1* | 6/2017 | Hsieh | H01L 21/32139 |

* cited by examiner

*Primary Examiner* — Farun Lu
(74) *Attorney, Agent, or Firm* — Winston Hsu

(57) ABSTRACT

A method of forming gates includes the following steps. Dummy gates are formed on a substrate. A spacer material is deposited to conformally cover the dummy gates. A removing process is performed to remove parts of the spacer material and the dummy gates, thereby forming spacers and recesses in the spacers.

12 Claims, 5 Drawing Sheets

METHOD OF FORMING GATE

BACKGROUND OF THE INVENTION

1. Field of the Invention

The present invention relates generally to a method of forming gates, and more specifically to a method of forming metal gates.

2. Description of the Prior Art

Poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, work function metals that are suitable for use as the high-K gate dielectric layer are used to replace the conventional poly-silicon gate to be the control electrode.

SUMMARY OF THE INVENTION

The present invention provides a method of forming gates, which removes dummy gates and forms spacers at the same time, thereby simplifying processes.

The present invention provides a method of forming gates including the following steps. Dummy gates are formed on a substrate. A spacer material is deposited to conformally cover the dummy gates. A removing process is performed to remove parts of the spacer material and the dummy gates, thereby forming spacers and recesses in the spacers.

According to the above, the present invention provides a method of forming gates, which performs a removing process to remove dummy gates and form spacers at the same time, thereby simplifying processes. The removing process is applied to remove the dummy gates, form the spacers, and serve as a dummy gate slot etching process, therefore reducing process flow and cycle time.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
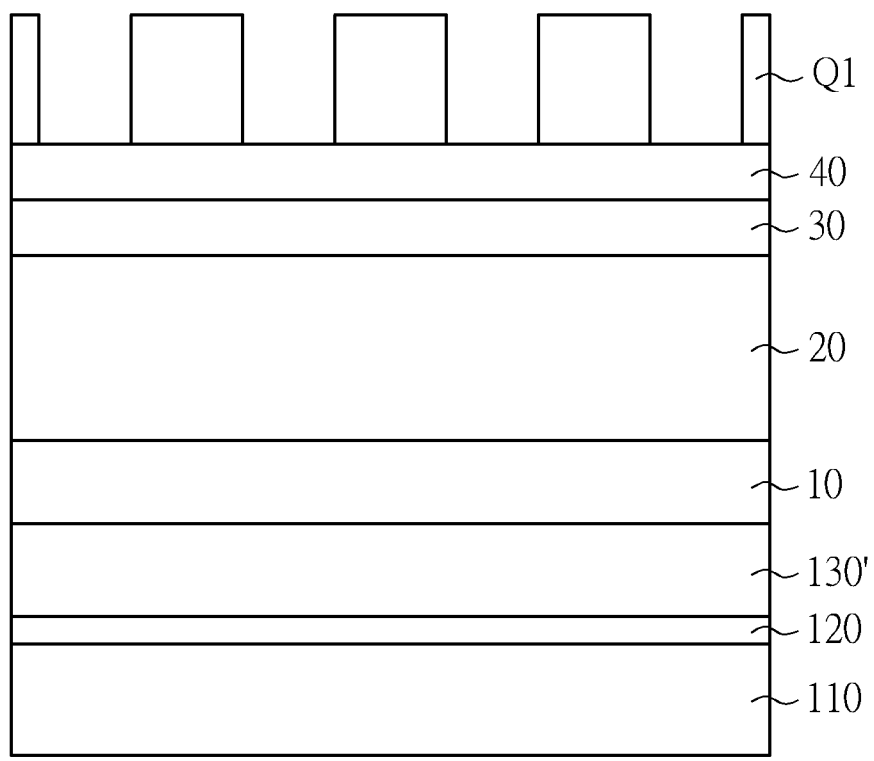
FIG. 1 schematically depicts a cross-sectional view of a method of forming gates according to an embodiment of the present invention.

FIGS. 1-2, 4, 6-9 schematically depict cross-sectional views of a method of forming gates according to an embodiment of the present invention. FIG. 3 and FIG. 5 schematically depict cross-sectional views and top views of a method of forming gates according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. A dielectric layer 120 is optionally formed on the substrate 110. The dielectric layer 120 may be an oxide layer, but it is not limited thereto.

Figure 2:
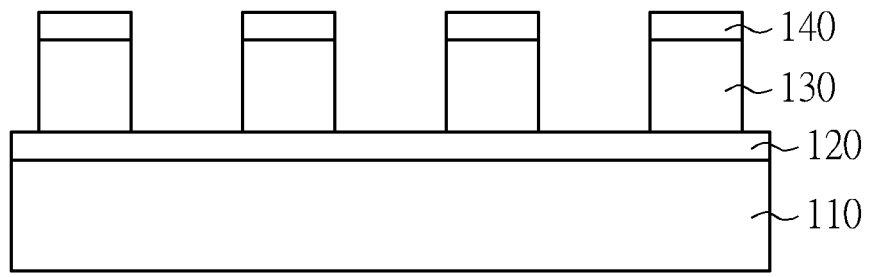
FIG. 2 schematically depicts a cross-sectional view of a method of forming gates according to an embodiment of the present invention.
Figure 3:
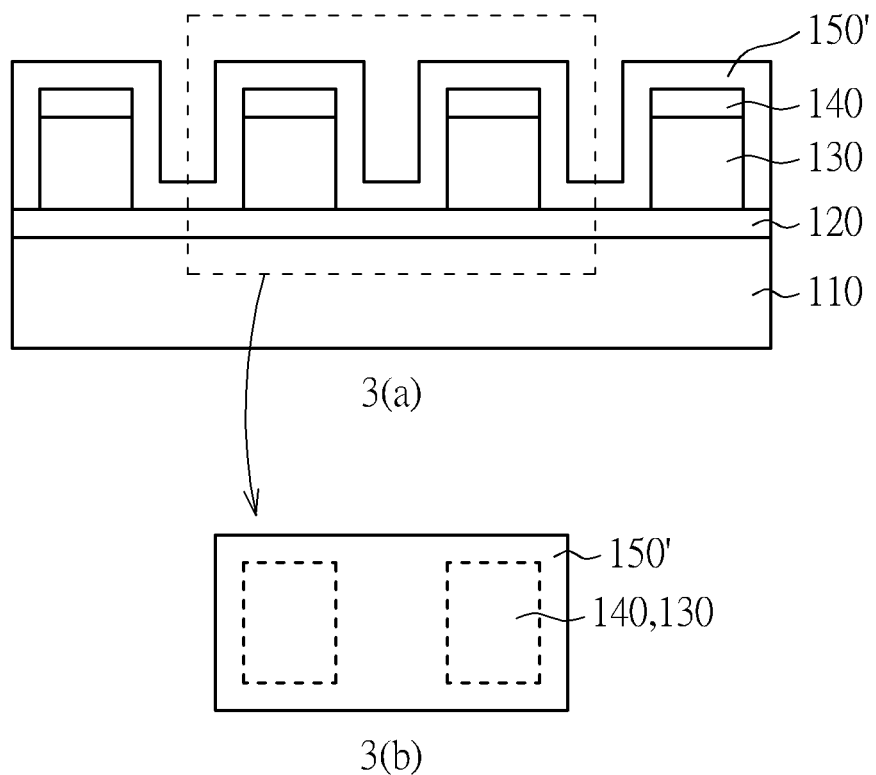
FIG. 3 schematically depicts a cross-sectional view and a top view of a method of forming gates according to an embodiment of the present invention.

Then, dummy gates 130 are formed on the substrate 110, as shown in FIG. 2. More precisely, as shown in FIG. 1, the dielectric layer 120, an amorphous silicon layer 130', a first hard mask layer 10, a second hard mask layer 20, an organic dielectric layer 30 and a silicon-containing hard-mask bottom antireflection coating (SHB) layer 40 are sequentially deposited on the substrate 110. In this embodiment, the first hard mask layer 10 may be a nitride layer while the second hard mask layer 20 may be an oxide layer, but it is not limited thereto. Preferably, the first hard mask layer 10 and the second hard mask layer 20 are different material layers. A photoresist layer Q1 is then formed on the silicon-containing hard-mask bottom antireflection coating (SHB) layer 40 to pattern the silicon-containing hard-mask bottom antireflection coating (SHB) layer 40, the organic dielectric layer 30, the second hard mask layer 20, the first hard mask layer 10 and the amorphous silicon layer 130' by photolithography processes. Therefore, the patterns of the photoresist layer Q1 is transferred to the silicon-containing hard-mask bottom antireflection coating (SHB) layer 40, the patterns of the silicon-containing hard-mask bottom antireflection coating (SHB) layer 40 is transferred to the organic dielectric layer 30, the patterns of the organic dielectric layer 30 is transferred to the second hard mask layer 20, the patterns of the second hard mask layer 20 is transferred to the first hard mask layer 10, the patterns of the first hard mask layer 10 is transferred to the amorphous silicon layer 130', thereby the dummy gates 130 being formed on the dielectric layer 120 and caps 140 being on the dummy gates 130, as shown in FIG. 2. In this case, the dummy gates 130, which are formed from the amorphous silicon layer 130', are composed of amorphous silicon while the caps 140, which are formed from the first hard mask layer 10 being a nitride layer, are composed of nitride, but it is not limited thereto. The caps 140 are selectively formed.

Thereafter, the silicon-containing hard-mask bottom antireflection coating (SHB) layer 40, the organic dielectric layer 30 and the second hard mask layer 20 are removed. In this case, the silicon-containing hard-mask bottom antireflection coating (SHB) layer 40, the organic dielectric layer 30, the second hard mask layer 20 and the first hard mask layer 10 serve as hard masks for transferring patterns to the amorphous silicon layer 130', but it is not limited thereto. In other cases, the hard masks may be other dielectric layers. Then, a cleaning process may be optionally performed to remove particles remaining after said processes.

As shown in FIG. 3, a spacer material 150' is deposited to conformally cover the dummy gates 130 and the caps 140. The spacer material 150' may be composed of nitride, but it is not limited thereto. FIG. 3 schematically depicts a cross-sectional view and a top view of a method of forming gates according to an embodiment of the present invention. FIG. 3(a) depicts a cross-sectional view, wherein the spacer material 150' conformally covers the dummy gates 130, the caps 140 and the dielectric layer 120. FIG. 3(b) depicts a top view of a part of the structure depicted in FIG. 3(a), wherein the spacer material 150' blanketly covers the dummy gates 130, the caps 140 and the dielectric layer 120.

Figure 4:
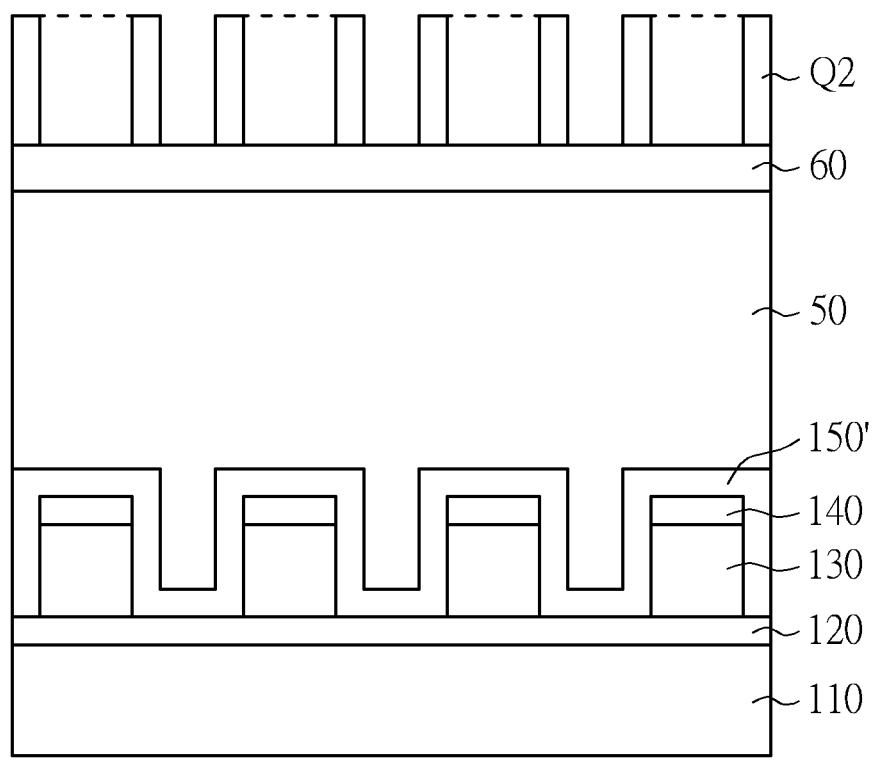
FIG. 4 schematically depicts a cross-sectional view of a method of forming gates according to an embodiment of the present invention.
Figure 5:
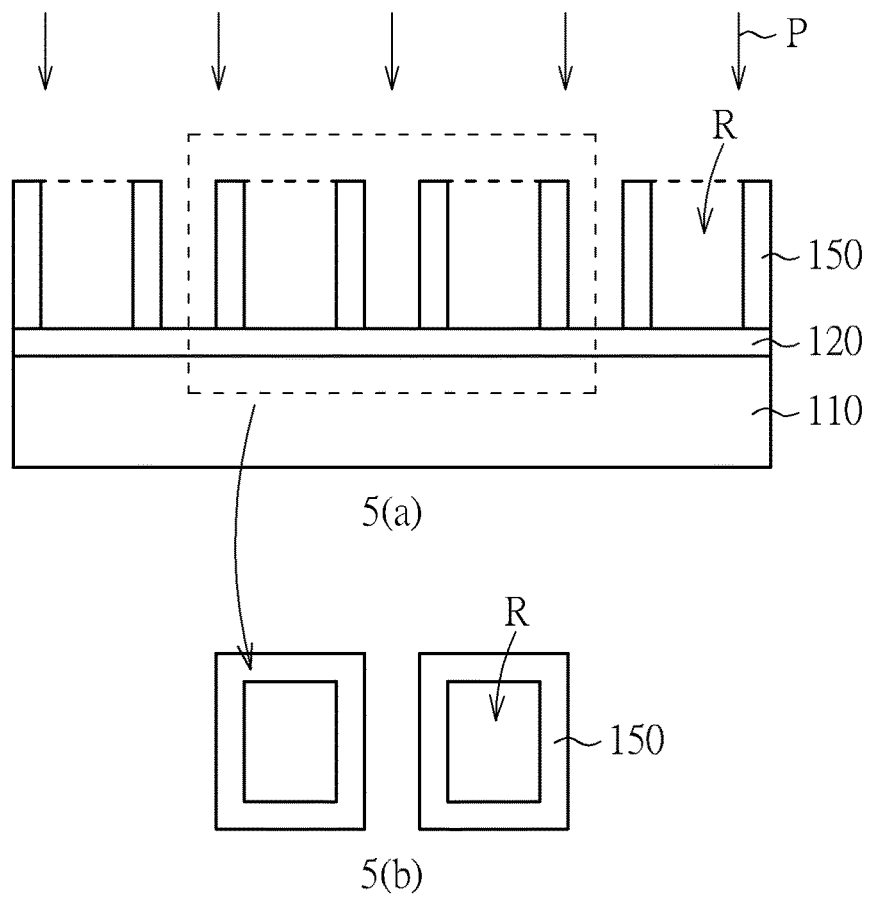
FIG. 5 schematically depicts a cross-sectional view and a top view of a method of forming gates according to an embodiment of the present invention.

Please refer to FIGS. 4-5, a removing process P is performed to remove parts of the spacer material 150', the caps 140 and the dummy gates 130, thereby forming spacers 150 and recesses R in the spacers 150. As shown in FIG. 4, an organic dielectric layer 50, a silicon-containing hard-mask bottom antireflection coating (SHB) layer 60 and a photoresist layer Q2 are sequentially deposited on the substrate 110. Then, the parts of the spacer material 150', the caps 140 and the dummy gates 130 are removed by photolithography processes, such that the patterns of the photoresist layer Q2 is transferred to the silicon-containing hard-mask bottom antireflection coating (SHB) layer 60, the patterns of the silicon-containing hard-mask bottom antireflection coating (SHB) layer 60 is transferred to the organic dielectric layer 50, and the patterns of the organic dielectric layer 50 is transferred to the spacer material 150', the caps 140 and the dummy gates 130, thereby the spacers 150 and the recesses R in the spacers 150 are formed, as shown in FIG. 5. FIG. 5 schematically depicts a cross-sectional view and a top view of a method of forming gates according to an embodiment of the present invention. FIG. 5(a) depicts the recesses R in the spacers 150. Preferably, the dummy gates 130 are removed completely by the removing process P and the recesses R expose the dielectric layer 120 for filling metal gates in the recesses R in later processes. FIG. 5(b) depicts the spacers 150 having frame shapes at the top view, and the spacers 150 surround areas of the dummy gates 130 depicted in FIGS. 2-4. In this embodiment, the spacers 150 enclose the areas of the dummy gates 130, and the removing process P can be not only removed the dummy gates 130 but also be utilized as a slot etching process of the dummy gates 130. Thereafter, a cleaning process is optionally performed to remove particles remaining after above processes.

Figure 6:
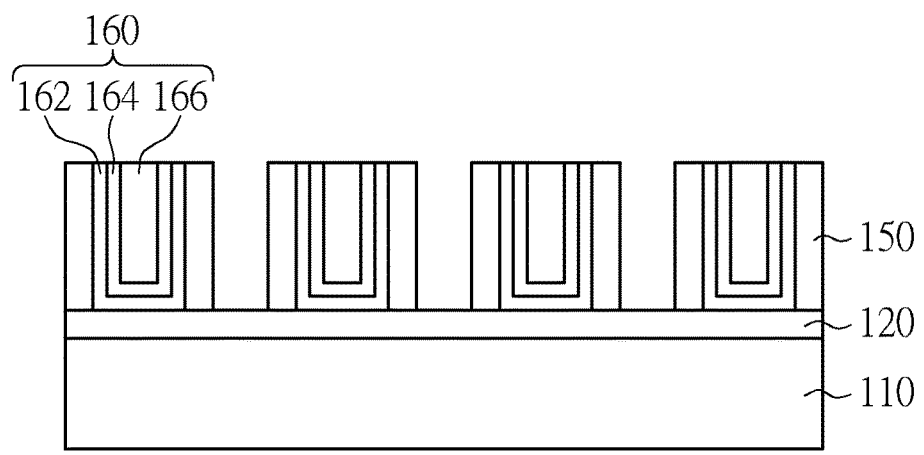
FIG. 6 schematically depicts a cross-sectional view of a method of forming gates according to an embodiment of the present invention.

Then, metal gates 160 fill in the recesses R, as shown in FIG. 6. Each of the metal gates 160 may include a buffer layer (not shown), a gate dielectric layer 162, a barrier layer (not shown), a work function metal layer 164 and a low resistivity material 166, wherein the buffer layer (not shown), the high-k dielectric layer 162, the barrier layer (not shown) and the work function metal layer 164 have U-shape cross-sectional profiles, but it is not limited thereto. The buffer layer may be an oxide layer, which may be formed through a chemical oxide process; the gate dielectric layer 162 may be a gate dielectric layer having a high dielectric constant, which may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_1{-}xO_3$, PZT) and barium strontium titanate ($Ba_xSr_{1-x}TiO_3$, BST); the barrier layer may be a single layer structure or a multilayer structure composed of tantalum nitride (TaN) or titanium nitride (TiN); the work function metal layer 164 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN); the low resistivity material 166 may be composed of aluminum, tungsten, titanium aluminum (TiAl) alloy, cobalt tungsten phosphide (CoWP), but it is not limited thereto.

Figure 7:
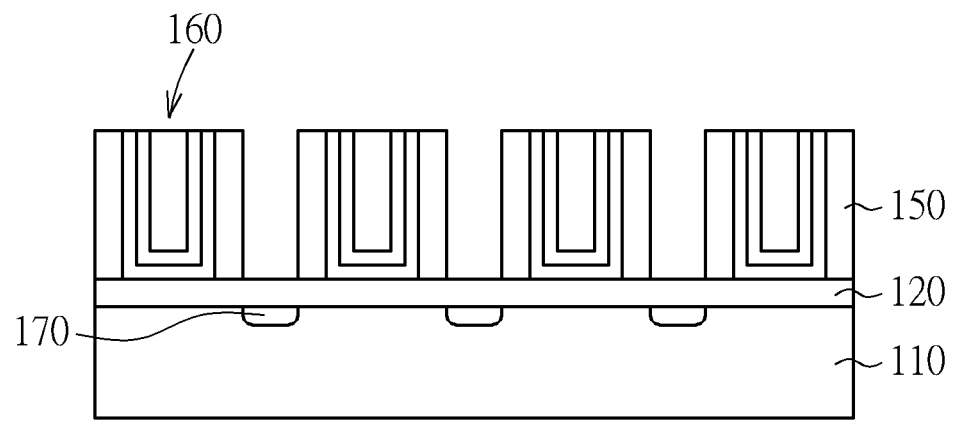
FIG. 7 schematically depicts a cross-sectional view of a method of forming gates according to an embodiment of the present invention.
Figure 8:
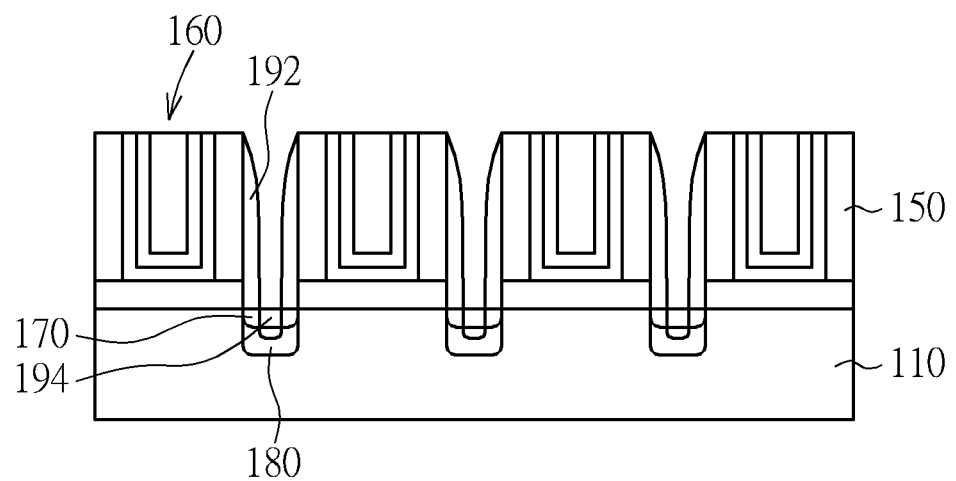
FIG. 8 schematically depicts a cross-sectional view of a method of forming gates according to an embodiment of the present invention.

As shown in FIG. 7, lightly doped source/drain regions 170 may be formed in the substrate 110 beside the metal gates 160 after the metal gates 160 are formed. As shown in FIG. 8, epitaxial structures 180 may be optionally formed in the substrate 110 beside the metal gates 160 after the metal gates 160 are formed. The epitaxial structures 180 may be silicon germanium (SiGe) epitaxial structures, silicon carbide (SiC) epitaxial structures, silicon phosphorus (SiP) epitaxial structures or etc. Methods of forming the epitaxial structures 180 may include etching the substrate 110 beside the metal gates 160 to form recesses (not shown), and then filling the epitaxial structures 180 in the recesses, but it is not limited thereto. Spacers 192 may be formed on the substrate 110 beside the metal gates 160, and then source/drain regions 194 may be formed in the substrate 110 beside the spacers 192.

Figure 9:
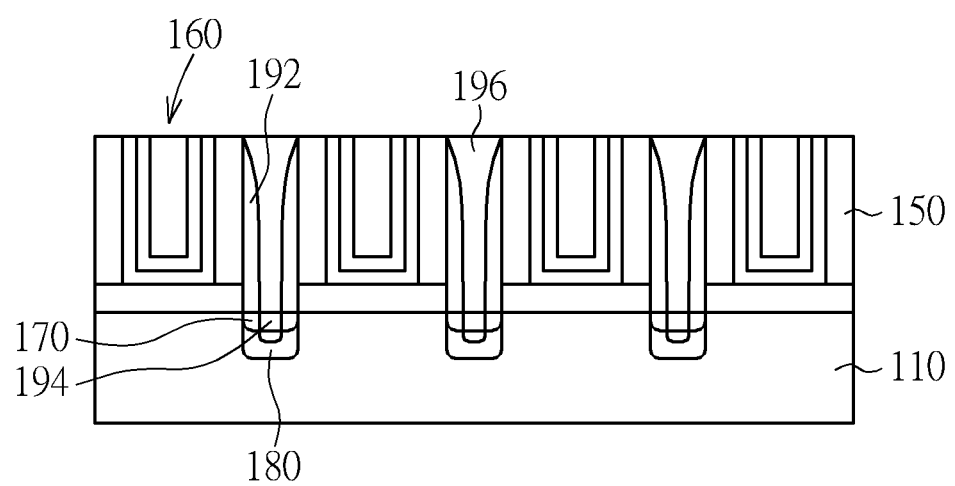
FIG. 9 schematically depicts a cross-sectional view of a method of forming gates according to an embodiment of the present invention.

As shown in FIG. 9, an interlayer dielectric layer 196 is formed on the substrate 110 beside the metal gates 160. The interlayer dielectric layer 196 may be an oxide layer, but it is not limited thereto. The interlayer dielectric layer 196 may be formed by depositing a blanket interlayer dielectric layer on the metal gates 160 and the substrate 110, and then planarizing the blanket interlayer dielectric layer to form the interlayer dielectric layer 196 having a flat top surface and expose the metal gates 160.

To summarize, the present invention provides a method of forming gates, which performs a removing process to remove dummy gates and form spacers at the same time, thereby simplifying processes. The removing process is applied to remove the dummy gates, form the spacers, and serve as a dummy gate slot etching process, therefore reducing process flow and cycle time.

Furthermore, the spacers of the present invention have frame shapes at the top view and surround areas of the dummy gates. Preferably, the spacers enclose the areas of the dummy gates. The dummy gates are removed and recesses are therefore in the spacers by the removing process, and then metal gates fill into the recesses. An interlayer dielectric layer, epitaxial structures, lightly doped source/drain regions and source/drain regions are inherently formed beside the metal gates after the metal gates are formed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming gates, comprising:
forming dummy gates on a substrate;

depositing a spacer material conformally covering the dummy gates; and performing a removing process to remove parts of the spacer material and the dummy gates, thereby forming spacers having frame shapes at a top view and recesses in the spacers at a same time wherein widths of tops of the spacers are equal to widths of bottoms of the spacers at a cross-sectional view, wherein the steps of performing the removing process to remove the parts of the spacer material and the dummy gates comprise:

sequentially depositing an organic dielectric layer, a silicon-containing hard-mask bottom antireflection coating (SHB) layer and a photoresist layer on the substrate; and removing the parts of the spacer material and the dummy gates by sequentially transferring patterns of the photoresist layer, the silicon-containing hard-mask bottom antireflection coating (SHB) layer and the organic dielectric layer, thereby forming the spacers and the recesses in the spacers.

2. The method of forming gates according to claim 1, further comprising:
filling metal gates in the recesses.

3. The method of forming gates according to claim 2, further comprising:
forming source/drain regions in the substrate beside the metal gates.

4. The method of forming gates according to claim 2, further comprising:
forming lightly doped source/drain regions in the substrate beside the metal gates.

5. The method of forming gates according to claim 2, further comprising:
forming epitaxial structures in the substrate beside the metal gates.

6. The method of forming gates according to claim 2, further comprising:
forming an interlayer dielectric layer beside the metal gates.

7. The method of forming gates according to claim 1, wherein the spacers surround areas of the dummy gates.

8. The method of forming gates according to claim 7, wherein the spacers enclose the areas of the dummy gates.

9. The method of forming gates according to claim 1, wherein the dummy gates are removed completely by the removing process.

10. The method of forming gates according to claim 1, wherein the steps of forming the dummy gates on the substrate comprise forming caps on the dummy gates.

11. The method of forming gates according to claim 1, further comprising:
forming a dielectric layer on the substrate before the dummy gates are formed.

12. The method of forming gates according to claim 11, wherein the steps of forming the dummy gates on the substrate comprise:

sequentially depositing the dielectric layer, an amorphous silicon layer, a first hard mask layer, a second hard mask layer, an organic dielectric layer and a silicon-containing hard-mask bottom antireflection coating (SHB) layer on the substrate; and patterning the amorphous silicon layer on the dielectric layer by using a photoresist layer on the silicon-containing hard-mask bottom antireflection coating (SHB) layer, and then sequentially transferring patterns of the photoresist layer, the silicon-containing hard-mask bottom antireflection coating (SHB) layer, the organic dielectric layer, the second hard mask layer, the first hard mask layer and the amorphous silicon layer, thereby forming the dummy gates on the dielectric layer.

* * * * *